(12) United States Patent
Shubin et al.

(10) Patent No.: US 8,796,811 B2
(45) Date of Patent: Aug. 5, 2014

(54) HYBRID SUBSTRATELESS DEVICE WITH ENHANCED TUNING EFFICIENCY

(75) Inventors: Ivan Shubin, San Diego, CA (US); Ashok V. Krishnamoorthy, San Diego, CA (US); John E. Cunningham, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 309 days.

(21) Appl. No.: 13/205,745

(22) Filed: Aug. 9, 2011

(65) Prior Publication Data
US 2013/0037905 A1 Feb. 14, 2013

(51) Int. Cl.
| | |
|---|---|
| H01L 27/12 | (2006.01) |
| H01L 21/50 | (2006.01) |
| G02B 6/10 | (2006.01) |
| H01L 27/146 | (2006.01) |
| H01L 27/148 | (2006.01) |

(52) U.S. Cl.
CPC ........ *H01L 27/1465* (2013.01); *H01L 27/1467* (2013.01); *H01L 27/14661* (2013.01); *H01L 27/14881* (2013.01)
USPC ............. 257/506; 257/43; 257/227; 257/698; 257/738; 257/E21.575; 257/E27.112; 257/E27.137; 257/E27.144; 257/E27.161; 257/E31.096; 438/104; 438/107; 438/629; 438/637

(58) Field of Classification Search
CPC ............ H01L 27/1465; H01L 27/1467; H01L 27/14661; H01L 27/14881
USPC ............ 257/43, 227, 506, 698, 738, E21.575, 257/E23.011, E27.112, E27.137, E27.144, 257/E27.161, E31.096; 438/104, 107, 629, 438/637
See application file for complete search history.

(56) References Cited

U.S. PATENT DOCUMENTS

| | | | | |
|---|---|---|---|---|
| 7,305,883 | B2 * | 12/2007 | Khuri-Yakub et al. | 73/579 |
| 8,354,282 | B2 * | 1/2013 | Stern | 438/22 |
| 8,428,404 | B1 * | 4/2013 | Shubin et al. | 385/14 |
| 2012/0001166 | A1 * | 1/2012 | Doany et al. | 257/43 |
| 2012/0187576 | A1 * | 7/2012 | Yu et al. | 257/777 |

OTHER PUBLICATIONS

A. V. Krishnamoorthy, et al., "Computer Systems Based on Silicon Photonic Interconnects", Proc. IEEE 97(7), pp. 1337-1361, 2009.
J. E. Cunningham, et al., "Highly-Efficient Thermally-Tuned Resonant Filters", Opt. Express, 18(18), pp. 19055-19063, 2010.
Shubin, Ivan et al., "Optical Resonators with High Thermal Tuning Efficiency", Patent SUN10-0276.

(Continued)

*Primary Examiner* — Dao H Nguyen
(74) *Attorney, Agent, or Firm* — Park, Vaughan, Fleming & Dowler LLP; Steven E. Stupp

(57) ABSTRACT

In a hybrid integrated module, a semiconductor die is mechanically coupled face-to-face to an integrated device in which the substrate has been removed. For example, the integrated circuit may include an optical device fabricated on a silicon-on-insulator (SOI) wafer in which the backside silicon handler has been completely removed, thereby facilitating improved device performance and highly efficient thermal tuning of the operating wavelength of the optical device. Moreover, the semiconductor die may be a VLSI chip that provides power, and serves as a mechanical handler and/or an electrical driver. The thermal tuning efficiency of the substrateless optical device may be enhanced by over 100× relative to an optical device with an intact substrate, and by 5× relative to an optical device in which the substrate has only been removed in proximity to the optical device.

16 Claims, 6 Drawing Sheets

(56) References Cited

OTHER PUBLICATIONS

Gun, C. "10Gb/s COMS Photonics Technology", Proc. of SPIE vol. 6125, p. 612501, 2006.

Thacker, H. et al., "Flip-Chip Integrated Silicon Photonic Bridge Chips for Sub-Picojoule per bit Optical Links", Proceeding of ECTC, 2010.

Yao, Jin et al., "Grating-couple-based optical proximity coupling for scalable computing systems", Proceedings of SPIE, vol. 7944, 2011.

* cited by examiner

HYBRID SUBSTRATELESS DEVICE WITH ENHANCED TUNING EFFICIENCY

GOVERNMENT LICENSE RIGHTS

This invention was made with Government support under Agreement No. HR0011-08-9-0001 awarded by DARPA. The Government has certain rights in the invention.

BACKGROUND

1. Field

The present disclosure relates to integrated modules. More specifically, the present disclosure relates to a hybrid integrated module that includes a semiconductor die mechanically coupled to an integrated device in which the substrate has been removed.

2. Related Art

The operating wavelengths of optical components, such as ring modulators, eschelle grating and ring-filtering devices, often differ from their target values. Origins of this difference include: process variability, manufacturing tolerances, and wafer thickness variations (notably, in the silicon device layer of silicon-on-insulator or SOI wafers). In the case of ring-resonator filters, these factors can affect the critical dimensions (CDs) of the ring resonator, with a corresponding impact on the propagating optical mode. Similar dependences have been observed in CMOS manufacturing, such as the performance dependence of an electronic device on the transistor-gate CD. In that case, continuous monitoring and optimization have been used to significantly reduce variations in the transistor-gate CD, thereby ensuring high VLSI yield and reliability. However, optical ring circuits are more susceptible to variations in CDs, even when they are fabricated using the same CMOS tool set and manufacturing standards. For example, $3\sigma$ wafer thickness variations on an SOI wafer or from wafer to wafer of 5% can shift the resonant wavelength by up to the free-spectral range (FSR) of a ring resonator.

Furthermore, silicon is characterized by a high thermo-optic coefficient, such that the resonant wavelength of a ring resonator fabricated on silicon can be tuned by changing the temperature, for example, by using thermal heaters proximate to the ring-resonator waveguide. Therefore, thermal tuning can be used to compensate for the differences between operating and target wavelengths. For example, using thermal tuning ring-resonator devices in an optical link can be matched to each other and their light sources.

However, depending on the device design, thermal tuning can consume significant power. In CMOS-based ring resonators, the heat generated in the ring resonator is dissipated through heat spreading in the silicon substrate and in the inter-layer dielectric stack up. Because the thermal conductivity of the crystalline silicon substrate underneath the ring resonator is very large, a significant fraction of system power is typically used to shift the ring resonance across its FSR to align to an appropriate optical channel and to correct mismatches corresponding to phase shifts up to $2\pi$.

Hence, what is needed is an integrated module that can be thermally tuned without the above-described problems.

SUMMARY

One embodiment of the present disclosure provides a hybrid integrated module. This hybrid integrated module may include a semiconductor die mechanically coupled face-to-face to an integrated device in which the substrate has been removed. For example, the integrated circuit may include an optical device (such as a wavelength-selective element or filter, a signal modulating element, or a light detecting element) fabricated on a silicon-on-insulator (SOI) wafer in which the backside silicon handler has been completely removed, thereby facilitating improved device performance and highly efficient thermal tuning of the operating wavelength of the optical device. Moreover, the semiconductor die may be a VLSI chip that provides power, and serves as a mechanical handler and/or an electrical driver. The thermal tuning efficiency of the substrateless optical device may be enhanced by over 100× relative to an optical device with an intact substrate, and by 5× relative to an optical device in which the substrate has only been removed in proximity to the optical device.

This architecture may also facilitate large-scale integration of hybrid integrated modules into a multi-chip module (MCM) that includes a larger bonded 2-dimensional array, in which the integrated devices in the hybrid integrated modules are optically coupled by optical couplers (such as diffraction grating couplers), which may be immediately optically accessible through the backside of the photonic layer because the silicon substrate has been removed. These arrays may enhance functionality and performance over a single-bonded hybrid integrated module, while ensuring high thermal tuning efficiency.

Moreover, properly arranged metal and/or dielectrics in or on the integrated device(s) may be used to form an optical mirror and/or to improve the optical coupling efficiency between the optical couplers.

Furthermore, once the silicon substrate is removed from a given integrated device and access to its optical couplers is established, a dense multi-functional 3-dimensional 'cube' structure may be fabricated by integrating multiple integrated devices on top of each other.

Additionally, in some embodiments the integrated circuit includes a semiconductor layer and an oxide layer, and an electro-optic material disposed on the back surface of the oxide layer, thereby facilitating tuning, routing or guiding of an optical signal in the optical device.

Another embodiment provides a method for fabricating the hybrid integrated module. During this method, the adhesive is applied to a top surface of the semiconductor die. Then, the integrated device is placed on an adhesive. Moreover, the integrated device includes: a semiconductor layer having a top surface and a bottom surface, where the top surface of the semiconductor layer is mechanically coupled to the adhesive; and the oxide layer disposed on the bottom surface of the semiconductor layer.

Another embodiment provides a system that includes the hybrid integrated module and/or the MCM.

Figure 1:
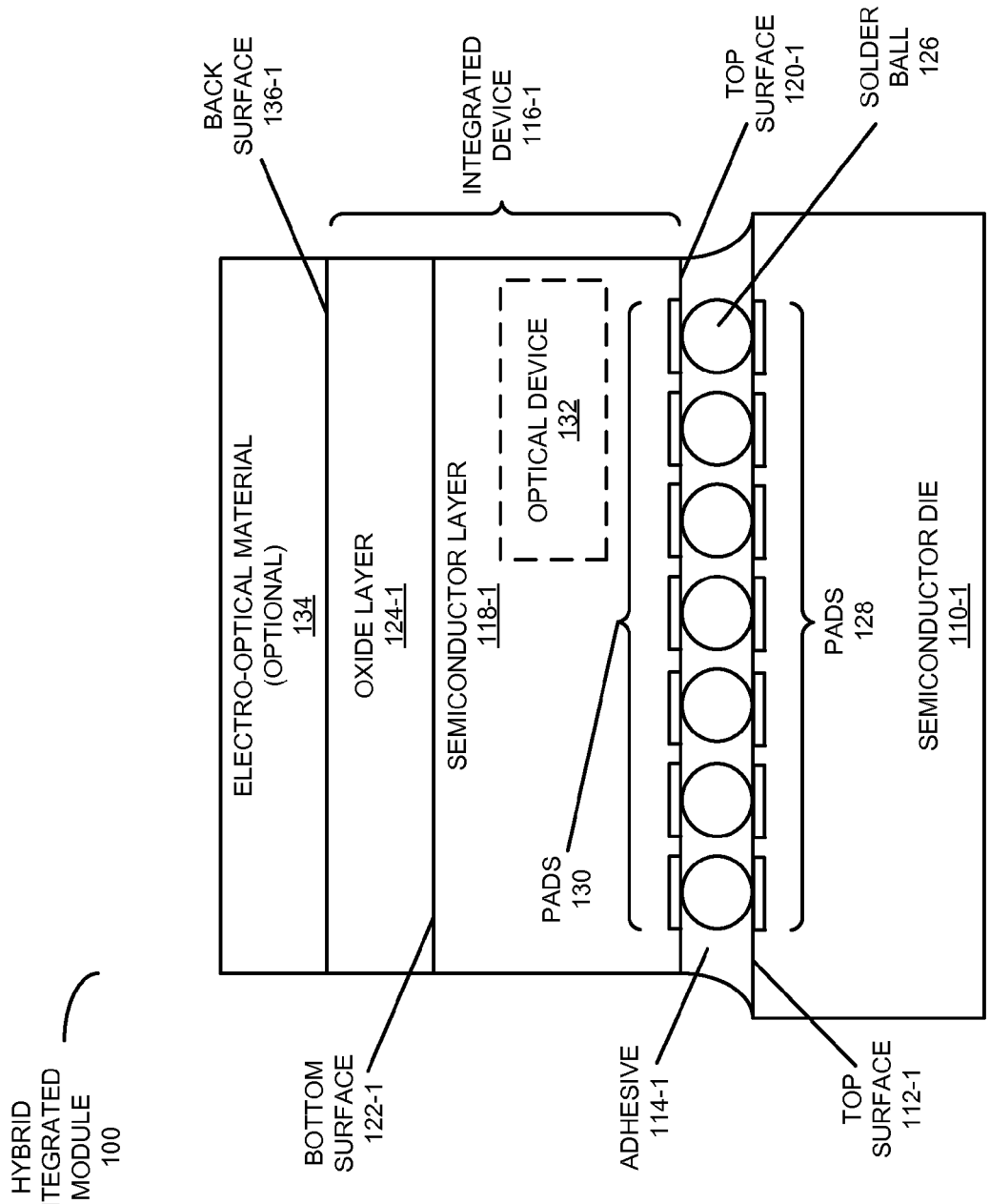
FIG. 1 is a block diagram of a hybrid integrated module in accordance with an embodiment of the present disclosure.

Table 1 provides simulated thermal impedance and tuning power for a ring resonator with different amounts of backside substrate undercut in an embodiment of a hybrid integrated module.

Note that like reference numerals refer to corresponding parts throughout the drawings. Moreover, multiple instances of the same part are designated by a common prefix separated from an instance number by a dash.

DETAILED DESCRIPTION

FIG. 1 presents a block diagram of a hybrid integrated module 100. This hybrid integrated module includes: a semiconductor die 110-1 having a top surface 112-1; an adhesive 114-1 (such as epoxy) mechanically coupled to top surface 112-1 of semiconductor die 110-1; and an integrated device 116-1. Moreover, integrated device 116-1 includes: a semiconductor layer 118-1 having a top surface 120-1 and a bottom surface 122-1, where top surface 120-1 is mechanically coupled to adhesive 114-1, so that semiconductor layer 118-1 and semiconductor die 110-1 are mounted face-to-face; and an oxide layer 124-1 disposed on bottom surface 122-1.

In addition to the mechanical coupling provided by adhesive 114-1, hybrid integrated module 100 may include solder balls, such as solder ball 126 (e.g., bondline micro-bumps or micro-solder), electrically coupling pads 128 on top surface 112-1 and pads 130 on top surface 120-1, where adhesive 114-1 at least in part fills a space between top surface 112-1 and top surface 120-1 (i.e., there may be underfill). Note that integrated device 116-1 may be mechanically coupled to semiconductor die 110-1 using a flip-chip technique.

In an exemplary embodiment, semiconductor layer 118-1 may include silicon, and oxide layer 124-1 may include a dielectric or an oxide, such as silicon dioxide. Thus, semiconductor layer 118-1 and oxide layer 124-1 may comprise a silicon-on-insulator (SOI) technology in which the semiconductor die on top of oxide layer 124-1 (such as the silicon-handler substrate) has been removed, for example, by mechanical polish and/or etching. This fabrication technique may require that thin semiconductor layer 118-1 be properly mechanically secured. In FIG. 1, this is accomplished by bonding this layer onto semiconductor die 110-1. Note that this bonding may be performed on a chip-to-chip basis or a chip-to-wafer basis. Furthermore, note that semiconductor die 110-1 may include silicon, such as an electrical driver chip.

Semiconductor layer 118-1 may include an optical device 132 (such as a wavelength-selective element or filter, a signal-modulating element, or a light-detecting element) that is thermally tuned. By removing the semiconductor die on top of oxide layer 124-1, the thermal resistance between optical device 132 and an environment external to hybrid integrated module 100 is significantly increased. Moreover, by removing the semiconductor die on top of oxide layer 124-1, optical device 132 may be optically accessed via bottom surface 122-1.

Because the electrical functions in hybrid integrated module 100 have been physically separated from the optical functions, these functions can be independently optimized. For example, constraints in existing SOI wafers on a thickness of oxide layer 124-1 may be removed. Consequently, oxide layer 124-1 may be thinner than in existing SOI wafers (such as a thickness between 200 and 300 nm, as opposed to 500-1000 nm). As a consequence, in some embodiments oxide layer 124-1 (in conjunction with the surrounding air) is an anti-reflective coating. Furthermore, note that semiconductor layer 118-1 may be 250-350 nm thick.

Additionally, removing the semiconductor die on top of oxide layer 124-1 may facilitate additional degrees of freedom. For example, optical device 132 may include an optical waveguide, and an optional liquid crystal or electro-optic material 134 may be disposed on a back surface 136-1 of oxide layer 124-1. This optional electro-optic material may tune, route or guide an optical signal in optical device 132.

An impact on the thermal impedance of the size of the opening in the semiconductor die on top of oxide layer 124-1, which is above an optical device having a 20 µm diameter device is summarized in Table 1. In particular, Table 1 provides simulated thermal impedance and tuning power for a ring resonator with different amounts of backside substrate undercut in an embodiment of hybrid integrated module 100.

TABLE 1

| Backside Undercut (µm) | Thermal Impedance (C/mW) | Improvement Ratio | Tuning Power (mW/FSR) |
| --- | --- | --- | --- |
| None | 1.1 | — | 97 |
| 30 | 3.7 | 3.4 | 28.5 |
| 100 | 8.5 | 7.7 | 12.6 |
| 500 | 20.4 | 18.5 | 5.2 |
| Removed substrate | 142 | 131 | 0.8 |

Note that the improvement ratios (i.e., the ratio of the thermal impedance of the structure with undercut to its original thermal impedance without the undercut) in Table 1 are very close to the experimentally obtained results. Moreover, the thermal impedance of the ring resonator continues to increase with the size of the backside undercut, thereby decreasing the power required to tune the ring resonator. In the case where the entire semiconductor die is removed, the thermal impedance is over 100× larger relative to the impedance of the original structure with an intact semiconductor die. In these configurations, the tuning power may be minimized at 0.8 mW/FSR, which corresponds to an efficiency of approximately 80 µW/nm or 0.63 µW/GHz. Thus, in order to take full advantage of this high thermal tuning efficiency, and thereby obtaining ultra-low tuning power consumption, the entire silicon-handler substrate may be removed. This may be accomplished without adversely impacting the performance and yield of the optical device.

Figure 2:
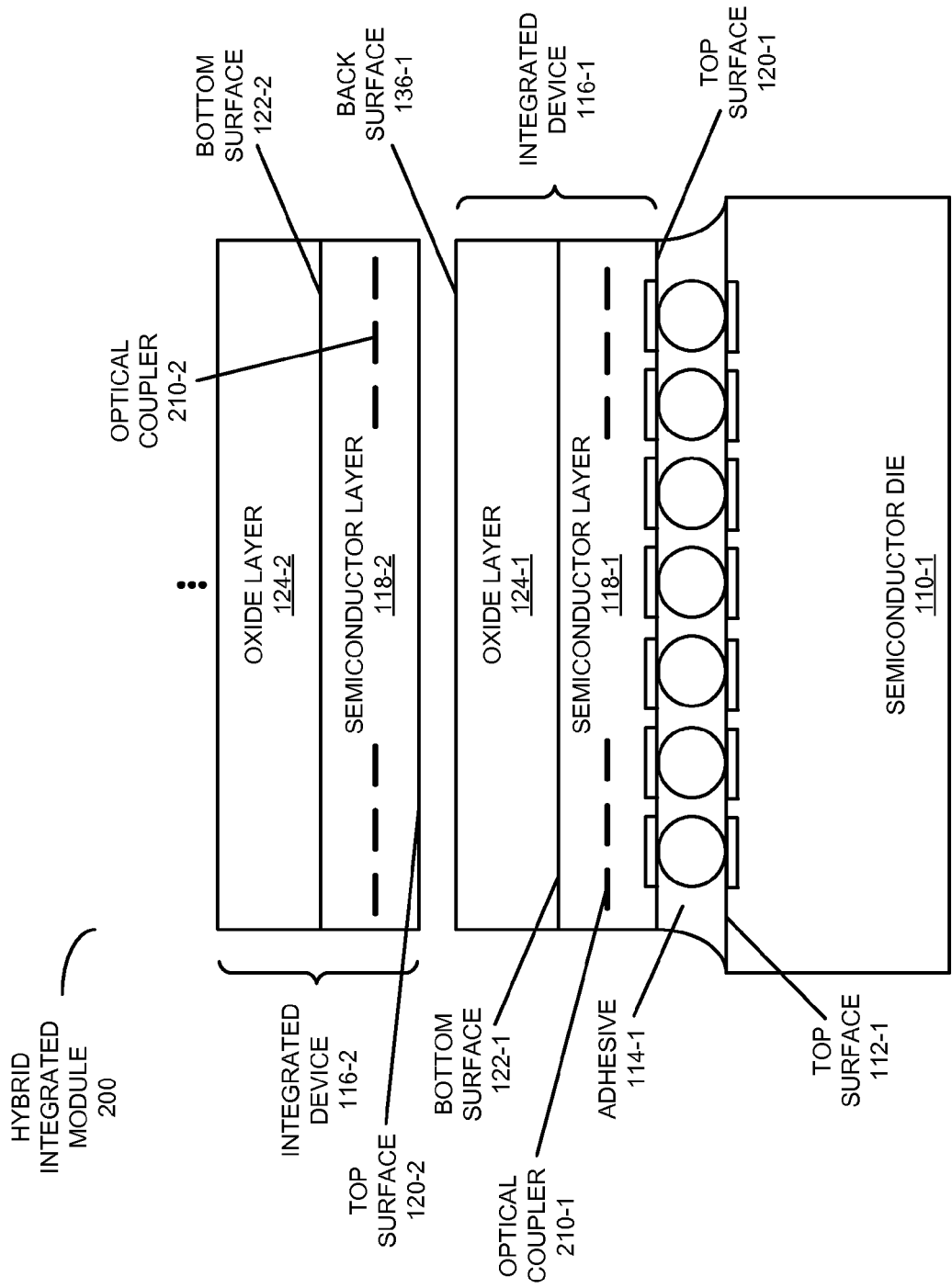
FIG. 2 is a block diagram of a hybrid integrated module in accordance with an embodiment of the present disclosure.
Figure 3:
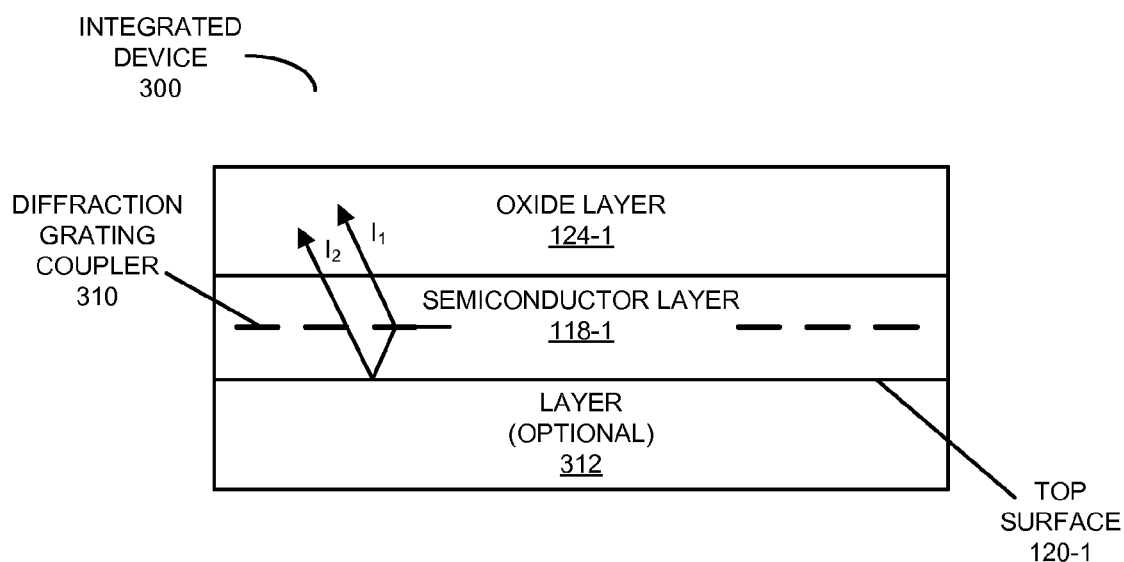
FIG. 3 is a block diagram of an integrated device in accordance with an embodiment of the present disclosure.

Because optical device 132 may be optically accessed via bottom surface 122-1, integrated device 116-1 may facilitate 3-dimensional integration of additional semiconductor dies on semiconductor die 110-1, thereby scaling up the component density and facilitating a variety of architectures and applications. This is shown in FIG. 2, which presents a block diagram of a hybrid integrated module 200. In particular, integrated devices 116 may be stacked in hybrid integrated module 200. Note that top surface 120-2 of semiconductor layer 118-2 in integrated device 116-2 faces back surface 136-1 of oxide layer 124-1 in integrated device 116-1.

In order to facilitate the 3-dimensional integration illustrated in FIG. 2, hybrid integrated module 200 may include optical couplers 210 (such as diffraction grating couplers or mirrors) that provide optical coupling between integrated devices 116.

For example, after the semiconductor die on top of oxide layer 124-1 in integrated device 116-1 is removed, optical coupler 210-1 may be defined. In particular, as shown in FIG.

3, which presents a block diagram of an integrated device 300, a diffraction grating coupler 310 may be defined in semiconductor layer 118-1.

In general, there is a loss of power during an optical coupling process when a propagation direction of an optical signal traveling in an optical waveguide is changed to normal to bottom surface 122-1. Some of this power loss is associated with a portion of the optical signal that is diffracted out of the plane normal to top surface 120-1. For example, an optical signal propagating in a silicon optical waveguide with an initial power of $I_0$ may be split into two diffraction orders with powers of $I_1$ and $I_2$, where $I_1$ is a portion of the optical signal coupled into the next grating coupler, while $I_2$ constitutes an optical loss.

To address this problem, an optional layer 312, such as a metal (e.g., copper) and/or inter-layer dielectrics, may be disposed on top surface 120-1. This layer may function as a mirror, thereby reflecting diffracted dissipated light $I_2$ back to coincide with $I_1$. By properly distancing layer 312 from diffraction grating coupler 310 (or by choosing an appropriate metal layer in the stack up as the mirror), the optical loss can be minimized and the optical coupling efficiency of diffraction grating coupler 310 can be improved.

Figure 4:
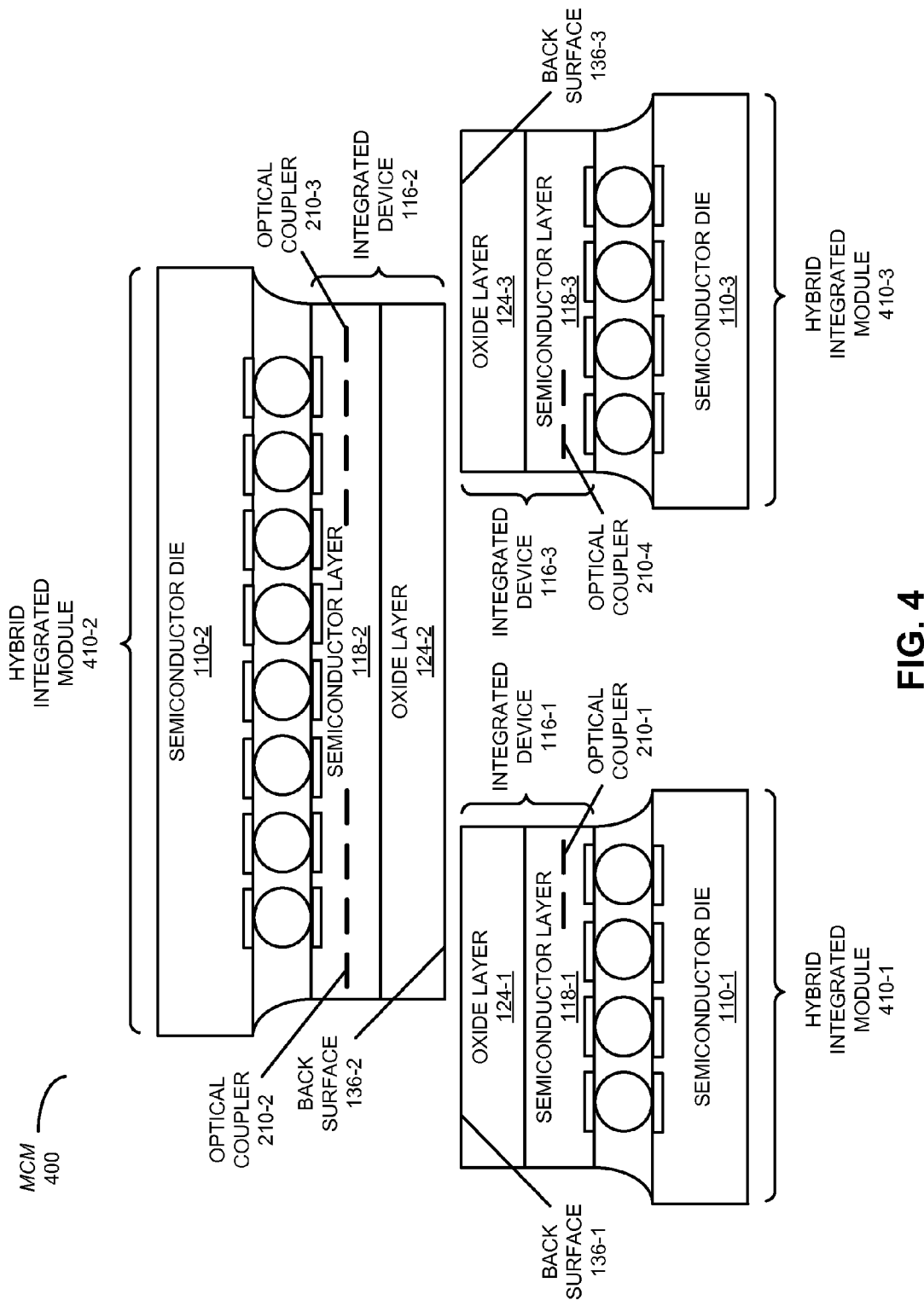
FIG. 4 is a block diagram of a multi-chip module (MCM) in accordance with an embodiment of the present disclosure.

Multiple hybrid integrated modules can be integrated into a multi-chip module (MCM). This is shown in FIG. 4, which presents a block diagram of an MCM 400. In particular, MCM 400 includes hybrid integrated modules 410 that are mounted so that their back surfaces 136 are facing each other. In this way, optical couplers 210 can be used to route the optical signal between integrated devices 116. In addition, optional optical fibers (not shown) can optically couple the optical signal (such as a wavelength-division-multiplexing signal) to and from MCM 400 (for example, using a normal incidence to back surfaces 136 of hybrid integrated modules 410-1 and 410-3). This approach can allow large, 2-dimensional arrays of integrated devices 116 to be optically coupled, thereby facilitating improved functionality and performance, while maintaining the high thermal tuning efficiency of the optical devices in semiconductor layers 118. While FIG. 4 illustrates hybrid integrated modules 110-1 and 110-3 optically coupled by hybrid integrated module 110-2, in other embodiments a conventional SOI wafer can be used to optically couple hybrid integrated modules 110-1 and 110-3, i.e., an optical waveguide in a semiconductor layer in an SOI wafer can face semiconductor layers 118 in integrated devices 116 and can optically couple the optical signal.

Figure 5:
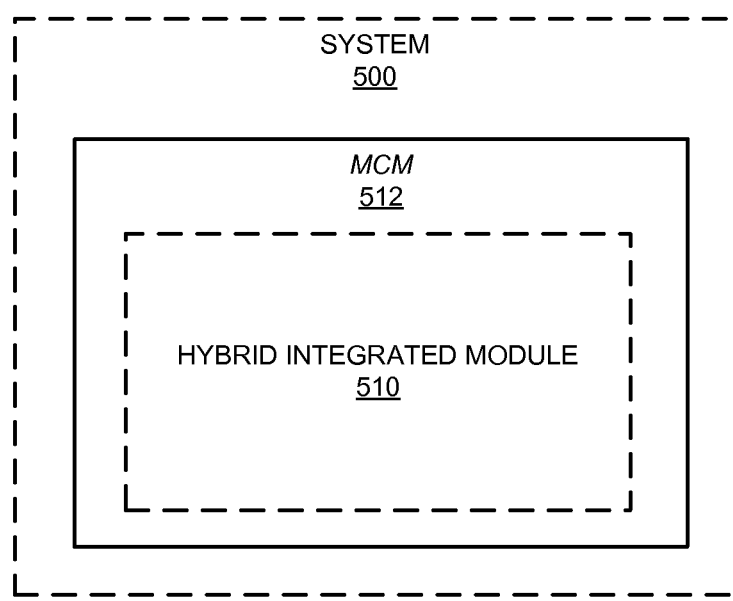
FIG. 5 is a block diagram illustrating a system that includes the hybrid integrated module of FIGS. 1-3 and/or the MCM of FIG. 4 in accordance with an embodiment of the present disclosure.

One or more of the preceding embodiments of the hybrid integrated module and/or the MCM may be included in a system and/or an electronic device. This is illustrated in FIG. 5, which presents a block diagram illustrating a system 500 that includes hybrid integrated module 510 and/or MCM 512.

The hybrid integrated module and/or the MCM may be used in a variety of applications, including: VLSI circuits, communication systems (such as WDM), storage area networks, data centers, networks (such as local area networks), and/or computer systems (such as multiple-core processor computer systems). Note that system 500 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

The preceding embodiments of the hybrid integrated module, the MCM, and/or system 400 may include fewer components or additional components. For example, semiconductor layer 118-1 in FIG. 1 may include poly-silicon or amorphous silicon. Furthermore, a wide variety of fabrication techniques may be used to fabricate the hybrid integrated module in the preceding embodiments, as is known to one of skill in the art. In addition, a wide variety of optical components may be used in or in conjunction with the hybrid integrated module.

Note that embodiments of optical device 132 in FIG. 1 can also be used when the optical device is electrically tuned. In these embodiments, it is still important that the optical device be thermally isolated from its external environment. Furthermore, while inclusion of optical device 132 in semiconductor layer 118-1 in integrated device 116-1 has been used as an illustrative example, in other embodiments the hybrid integrated modules do not include an optical device.

Although these embodiments are illustrated as having a number of discrete items, the embodiments are intended to be functional descriptions of the various features that may be present rather than structural schematics of the embodiments described herein. Consequently, in these embodiments two or more components may be combined into a single component, and/or a position of one or more components may be changed.

Figure 6:
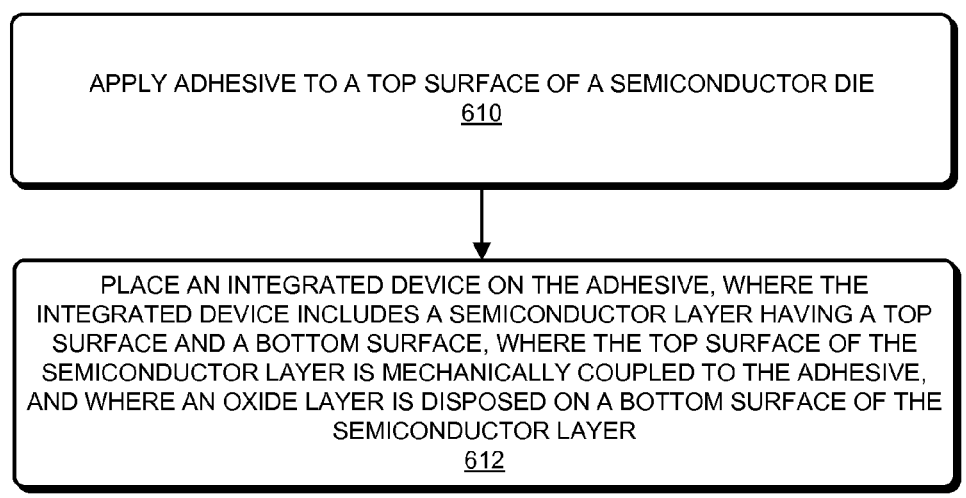
FIG. 6 is a flow chart illustrating a method for fabricating a hybrid integrated module in accordance with an embodiment of the present disclosure.

We now describe embodiments of the method. FIG. 6 presents a flow chart illustrating a method 600 for fabricating the hybrid integrated module. During this method, the adhesive is applied to the top surface of the semiconductor die (operation 610). Then, the integrated device is placed on the adhesive (operation 612). Note that the integrated device includes: the semiconductor layer having the top surface and the bottom surface, where the top surface of the semiconductor layer is mechanically coupled to the adhesive; and the oxide layer disposed on the bottom surface of the semiconductor layer.

In some embodiments of method 600, there may be additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A hybrid integrated module, comprising:
a semiconductor die having a top surface;
an adhesive mechanically coupled to the top surface of the semiconductor die;
a first integrated device manufactured using silicon-on-insulator (SOI) technology, wherein SOI technology comprises interposing a first silicon oxide layer between a first semiconductor layer and a first silicon-handler substrate, and wherein the first semiconductor layer includes:

a top surface, wherein the top surface of the first semiconductor layer is mechanically coupled to the adhesive; and a bottom surface, wherein the first silicon oxide layer is disposed on the bottom surface of the first semiconductor layer; and a second integrated device manufactured using SOI technology, wherein SOI technology comprises interposing a second silicon oxide layer between a second semiconductor layer and a second silicon-handler substrate, and wherein the second semiconductor layer includes:

a top surface, wherein the top surface of the second semiconductor layer faces a surface of the first silicon oxide layer, thereby enabling 3-dimensional integration of the first and second integrated devices; and a bottom surface, wherein the second silicon oxide layer is disposed on the bottom surface of the second semiconductor layer.

2. The hybrid integrated module of claim 1, further comprising solder balls electrically coupling pads on the top surface of the semiconductor die and pads on the top surface of the first semiconductor layer, wherein the adhesive at least in part fills a space between the top surface of the semiconductor die and the top surface of the first semiconductor layer.

3. The hybrid integrated module of claim 1, wherein the first semiconductor layer and the first silicon oxide layer are mechanically coupled to the semiconductor die using a flip-chip technique.

4. The hybrid integrated module of claim 1, wherein the first and second semiconductor layers includes silicon and the first and second silicon oxide layers includes silicon dioxide.

5. The hybrid integrated module of claim 1, wherein the first semiconductor layer includes an optical device; and
wherein the optical device is configured to be thermally tuned.

6. The hybrid integrated module of claim 5, wherein the first semiconductor layer and the first silicon oxide layer comprise a silicon-on-insulator technology in which the silicon-handler substrate was completely removed during manufacturing, thereby increasing a thermal resistance between the optical device and an environment external to the hybrid integrated module.

7. The hybrid integrated module of claim 5, wherein the optical device is configured to be optically accessed via the bottom surface of the first semiconductor layer.

8. The hybrid integrated module of claim 1, wherein the first semiconductor layer includes an optical coupler configured to optically couple an optical signal out of a plane of the first semiconductor layer.

9. The hybrid integrated module of claim 1, further comprising an optical coupler defined in a metal layer disposed between the adhesive and the top surface of the first semiconductor layer.

10. The hybrid integrated module of claim 1, wherein the first silicon oxide layer is configured as an anti-reflective coating.

11. The hybrid integrated module of claim 1, wherein the first silicon oxide layer has a thickness less than 300 nm.

12. A multi-chip module (MCM), comprising:
a first hybrid integrated module comprising:
a first semiconductor die having a top surface;
a first adhesive mechanically coupled to the top surface of the first semiconductor die; and
a first integrated device manufactured using silicon-on-insulator (SOI) technology, wherein SOI technology comprises interposing a first silicon oxide layer between a first semiconductor layer and a first silicon-handler substrate, wherein the first semiconductor layer includes:

a top surface, wherein the top surface of the first semiconductor layer is mechanically coupled to the first adhesive; and a bottom surface, wherein the first silicon oxide layer is disposed on the bottom surface of the first semiconductor layer, wherein the first silicon oxide layer has a back surface on an opposite side of the first semiconductor layer; and a second hybrid integrated module comprising:
a second semiconductor die having a top surface;
a second adhesive mechanically coupled to the top surface of the second semiconductor die; and
a second integrated device manufactured using SOI technology, wherein SOI technology comprises interposing a second silicon oxide layer between a second semiconductor layer and a second silicon-handler substrate, wherein the second semiconductor layer includes:

a top surface, wherein the top surface of the second semiconductor layer is mechanically coupled to the second adhesive; and a bottom surface, wherein the second silicon oxide layer is disposed on the bottom surface of the second semiconductor layer, wherein the second silicon oxide layer has a back surface on an opposite side of the second semiconductor layer; and wherein the back surfaces of the first and second silicon oxide layers face each other in the MCM.

13. The MCM of claim 12, wherein the first semiconductor layer includes an optical device; and
wherein the optical device is configured to be thermally tuned.

14. The MCM of claim 13, wherein the first semiconductor layer and the first silicon oxide layer comprise a silicon-on-insulator technology in which the silicon-handler substrate was completely removed during manufacturing, thereby increasing a thermal resistance between the optical device and an environment external to the hybrid integrated module.

15. The MCM of claim 13, wherein the optical device is configured to be optically accessed via the bottom surface of the first semiconductor layer.

16. A method for fabricating a hybrid integrated module, the method comprising:
applying an adhesive to a top surface of a semiconductor die;
placing a first integrated device manufactured using silicon-on-insulator (SOI) technology on the adhesive, wherein SOI technology comprises interposing a first silicon oxide layer between a first semiconductor layer and a first silicon-handler substrate, and wherein the first semiconductor layer includes:
a top surface, wherein the top surface of the first semiconductor layer is mechanically coupled to the adhesive; and
a bottom surface, wherein the first silicon oxide layer is disposed on the bottom surface of the first semiconductor layer; and
placing a second integrated device manufactured using SOI technology on the first integrated device, wherein SOI technology comprises interposing a second silicon oxide layer between a second semiconductor layer and a second silicon-handler substrate, and wherein the second semiconductor layer includes:

a top surface, wherein the top surface of the second semiconductor layer faces a surface of the first silicon oxide layer, thereby enabling 3-dimensional integration of the first and second integrated devices; and a bottom surface, wherein the second silicon oxide layer is disposed on the bottom surface of the second semiconductor layer.

\* \* \* \* \*

UNITED STATES PATENT AND TRADEMARK OFFICE
CERTIFICATE OF CORRECTION

PATENT NO.         : 8,796,811 B2                                     Page 1 of 1
APPLICATION NO.    : 13/205745
DATED              : August 5, 2014
INVENTOR(S)        : Shubin et al.

It is certified that error appears in the above-identified patent and that said Letters Patent is hereby corrected as shown below:

In the Claims

In column 7, line 31, in Claim 4, delete "includes" and insert -- include --, therefor.

In column 7, line 32, in Claim 4, delete "includes" and insert -- include --, therefor.

Signed and Sealed this
Tenth Day of March, 2015

Michelle K. Lee
*Deputy Director of the United States Patent and Trademark Office*